(12) United States Patent
Houston et al.

(10) Patent No.: US 7,768,820 B2
(45) Date of Patent: Aug. 3, 2010

(54) FEEDBACK STRUCTURE FOR AN SRAM CELL

(75) Inventors: Theodore W. Houston, Richardon, TX (US); Howard L. Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 190 days.

(21) Appl. No.: 11/969,589

(22) Filed: Jan. 4, 2008

(65) Prior Publication Data
US 2009/0175062 A1 Jul. 9, 2009

(51) Int. Cl.
*G11C 11/00* (2006.01)
(52) U.S. Cl. ............... 365/156; 365/154; 365/63
(58) Field of Classification Search .......... 365/156, 365/154, 63
See application file for complete search history.

(56) References Cited

U.S. PATENT DOCUMENTS

| | | | |
|---|---|---|---|
| 5,905,290 A | 5/1999 | Houston | |
| 6,285,580 B1 * | 9/2001 | Phan et al. | 365/156 |
| 7,295,459 B2 * | 11/2007 | Islam | 365/156 |
| 2007/0166912 A1 * | 7/2007 | Fenigstein et al. | 438/238 |

OTHER PUBLICATIONS

Houston, U.S. Appl. No. 11/969,636; filed Jan. 4, 2008; entitled, "SRAM Employing a Read-Enabling Capacitance."

* cited by examiner

*Primary Examiner*—Son Dinh
*Assistant Examiner*—Nam Nguyen
(74) *Attorney, Agent, or Firm*—Rose Alyssa Keagy; W. James Brady; Frederick J. Telecky, Jr.

(57) ABSTRACT

Embodiments of the present disclosure provide a feedback structure, a method of constructing a feedback structure and an integrated circuit employing the feedback structure. In one embodiment, the feedback structure is for use with an integrated circuit and includes a local interconnect configured to electrically connect an output of a CMOS inverter to another circuit in the integrated circuit. Additionally, the feedback structure also includes an interconnect extension to the local interconnect configured to proximately extend along a gate structure of the CMOS inverter to provide a reactive coupling between the output and the gate structure.

20 Claims, 6 Drawing Sheets

US 7,768,820 B2

FEEDBACK STRUCTURE FOR AN SRAM CELL

TECHNICAL FIELD

The present disclosure is directed, in general, to semiconductor memory and, more specifically, to a feedback structure, a method of constructing a feedback structure and an integrated circuit that employs the structure or the method.

BACKGROUND

A typical SRAM device is designed to store many thousands of bits of information. These bits are stored in individual cells, organized in rows and columns to make efficient use of space on a semiconductor substrate containing the SRAM device. A commonly used cell architecture is known as the "6T" cell, by virtue of having six MOS transistors. Four transistors defining an SRAM cell core or memory element are configured as cross-coupled CMOS inverters, which act as a bistable circuit that indefinitely holds the state imposed onto it while powered. Each CMOS inverter includes a load or "pull-up" transistor and a driver or "pull-down" transistor. The output of the two inverters will be in opposite states, except during transitions from one state to another. Two additional transistors are known as "pass gate" transistors, which provide access to the cross-coupled inverters during a read operation (herein referred to as READ) or write operation (herein referred to as WRITE). The gate inputs of the pass transistors are typically connected in common to a "word line". The drain of one pass gate transistor is connected to a "bit line", while the drain of the other pass gate transistor is connected to the logical complement of the bit line. Although present memory systems provide acceptable performance, improvements that provide more stable operating characteristics would be beneficial in the art.

SUMMARY

Embodiments of the present disclosure provide a feedback structure, a method of constructing a feedback structure and an integrated circuit employing the feedback structure. In one embodiment, the feedback structure is for use with an integrated circuit and includes a local interconnect configured to electrically connect an output of a CMOS inverter to another circuit in the integrated circuit. Additionally, the feedback structure also includes an interconnect extension to the local interconnect configured to proximately extend along a gate structure of the CMOS inverter to provide a reactive coupling between the output and the gate structure.

In another aspect, the present disclosure provides a method of constructing a feedback structure for use with an integrated circuit. The method includes providing a local interconnect between an output of a CMOS inverter and another circuit in the integrated circuit, and adding an extension to the local interconnect proximately extending along a gate structure of the CMOS inverter to provide a reactive coupling between the output and the gate structure.

The present disclosure also provides, in yet another aspect, an integrated circuit. The integrated circuit has an SRAM cell, which includes a pair of CMOS inverters and a feedback structure. The feedback structure has first and second local interconnects that electrically connect first and second outputs to respective second and first gates of the pair of CMOS inverters to provide a memory element. The feedback structure also has first and second interconnect extensions to the first and second local interconnects that proximately extend along respective first and second gate structures of the pair of CMOS inverters to provide a first reactive coupling between the first output and the first gate structure and a second reactive coupling between the second output and the second gate structure. The SRAM cell also includes first and second passgate MOS transistors that are controlled by a word line and are respectively connected between the first output and a first bit line and the second output and a second bit line.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Figure 1:
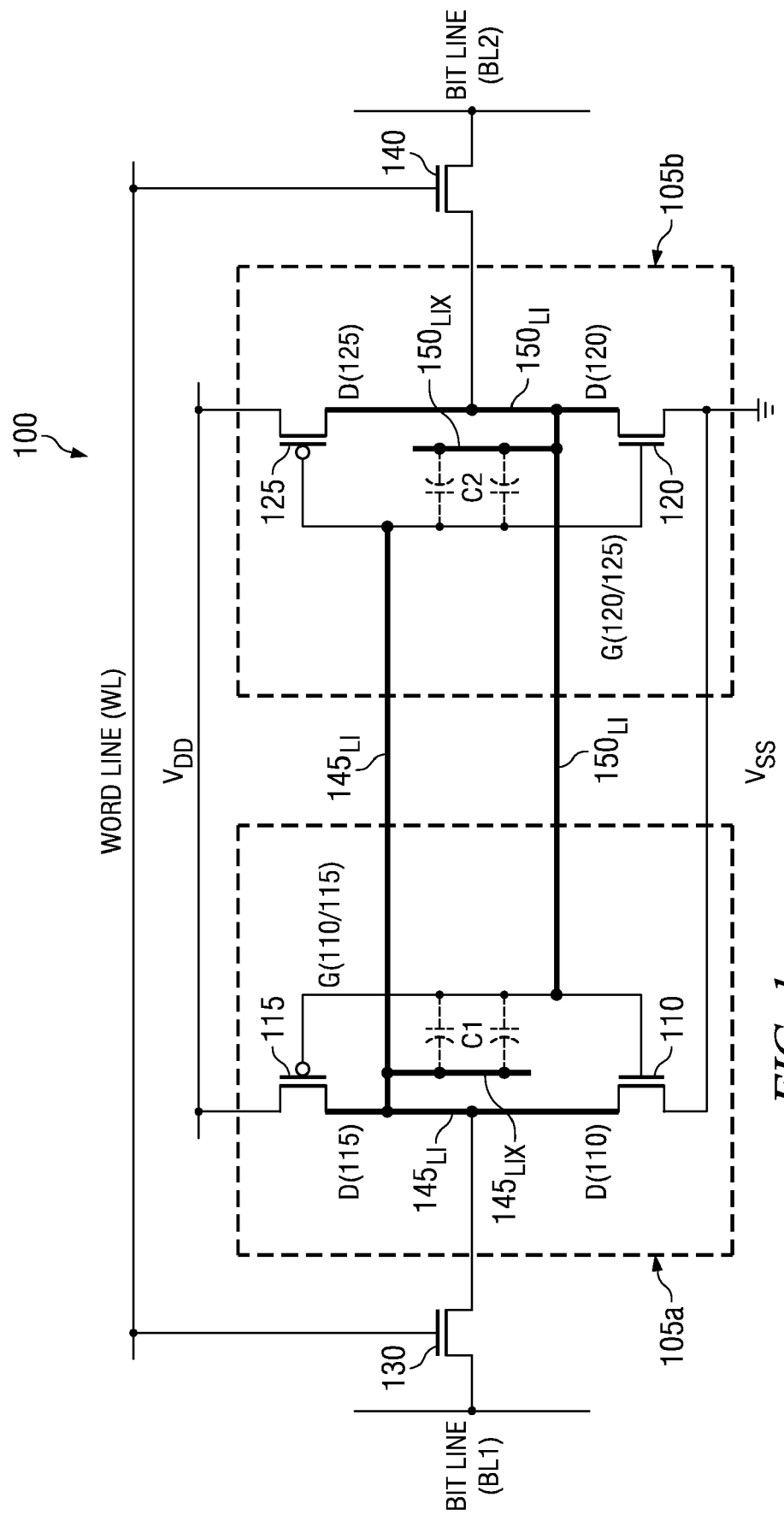
FIG. 1 illustrates an embodiment of an integrated circuit 6T SRAM cell constructed according to the principles of the present disclosure.

FIG. 1 illustrates an embodiment of an integrated circuit 6T SRAM cell 100 constructed according to the principles of the present disclosure. The 6T SRAM cell 100 includes a pair of CMOS inverters consisting of first and second CMOS inverters 105a, 105b. The first CMOS inverter 105a includes first pull-down and pull-up transistors 110, 115 having a first output provided by a portion of a first local interconnect $145_{LI}$ that electrically connects a first drain D(110) to a second drain D(115), as shown. Correspondingly, the second CMOS inverter 105b includes second pull-down and pull-up transistors 120, 125 having a second output provided by a portion of a second local interconnect $150_{LI}$ that electrically connects a third drain D(120) to a fourth drain D(125), as also shown.

The first CMOS inverter 105a also includes a first gate structure G(110/115) that electrically connects the gates of the first pull-down and pull-up transistors 110, 115 together. Correspondingly, the second CMOS inverter 105b also includes a second gate structure G(120/125) that electrically connects the gates of the second pull-down and pull-up transistors 120, 125 together. Another portion of the first local interconnect $145_{LI}$ electrically connects the first output to the second gate structure G(120/125), and another portion of the second local interconnect $150_{LI}$ electrically connects the second output to the first gate structure G(110/115).

The first and second local interconnects $145_{LI}$, $150_{LI}$ form a portion of a feedback structure that allows the first and second CMOS inverters 105*a*, 105*b* to provide a memory element. First and second interconnect extensions $145_{LIX}$, $150_{LIX}$ to the first and second local interconnects $145_{LI}$, $150_{LI}$ form another portion of the feed back structure. The first interconnect extension $145_{LIX}$ proximately extends along the first gate structure G(110/115) to provide a first reactive coupling between the first local interconnect $145_{LI}$ (the first output) and the first gate structure G(110/115). Correspondingly, the second interconnect extension $150_{LIX}$ proximately extends along the second gate structure G(120/125) to provide a second reactive coupling between the second local interconnect $150_{LI}$ (the second output) and the second gate structure G(120/125).

In the illustrated embodiment, the first reactive coupling is provided by a first incremental capacitance C1 that is distributed between the first interconnect extension $145_{LIX}$ and the first gate structure G(110/115). The second reactive coupling is provided by a second incremental capacitance C2 that is distributed between the second interconnect extension $150_{LIX}$ and the second gate structure G(120/125). The 6T SRAM cell 100 also includes first and second pass-gate MOS transistors 130, 140 that are controlled by a word line WL and are respectively connected between the first output and a first bit line BL1 and the second output and a second bit line BL2.

Memory element operation of the 6T SRAM cell 100 to store and retrieve data is well known to one skilled in the pertinent art. Also well known is that an operating environment of the 6T SRAM cell 100 may tend to destabilize the data stored within the cell and thereby provide data errors. In particular, when the word line WL is asserted to turn on the first and second pass-gate MOS transistors 130, 140, the voltages on the first and second bit lines BL1, BL2 may cause upset of the cell, especially with imbalance in the cell from variation in manufacture. The first and second reactive couplings provide stabilizing feedback that enhances stability for the 6T SRAM cell 100.

These stabilizing feedback signals provide negative feedback signals that tend to maintain the data stored within the cell and thereby insolate the cell from upset due to high frequency, spurious signals. The feedback energy provided by the first and second reactive couplings is not large enough to interfere with normal writing, however. Additionally, other embodiments may employ only one reactive coupling as required by a particular application.

Figure 2A:
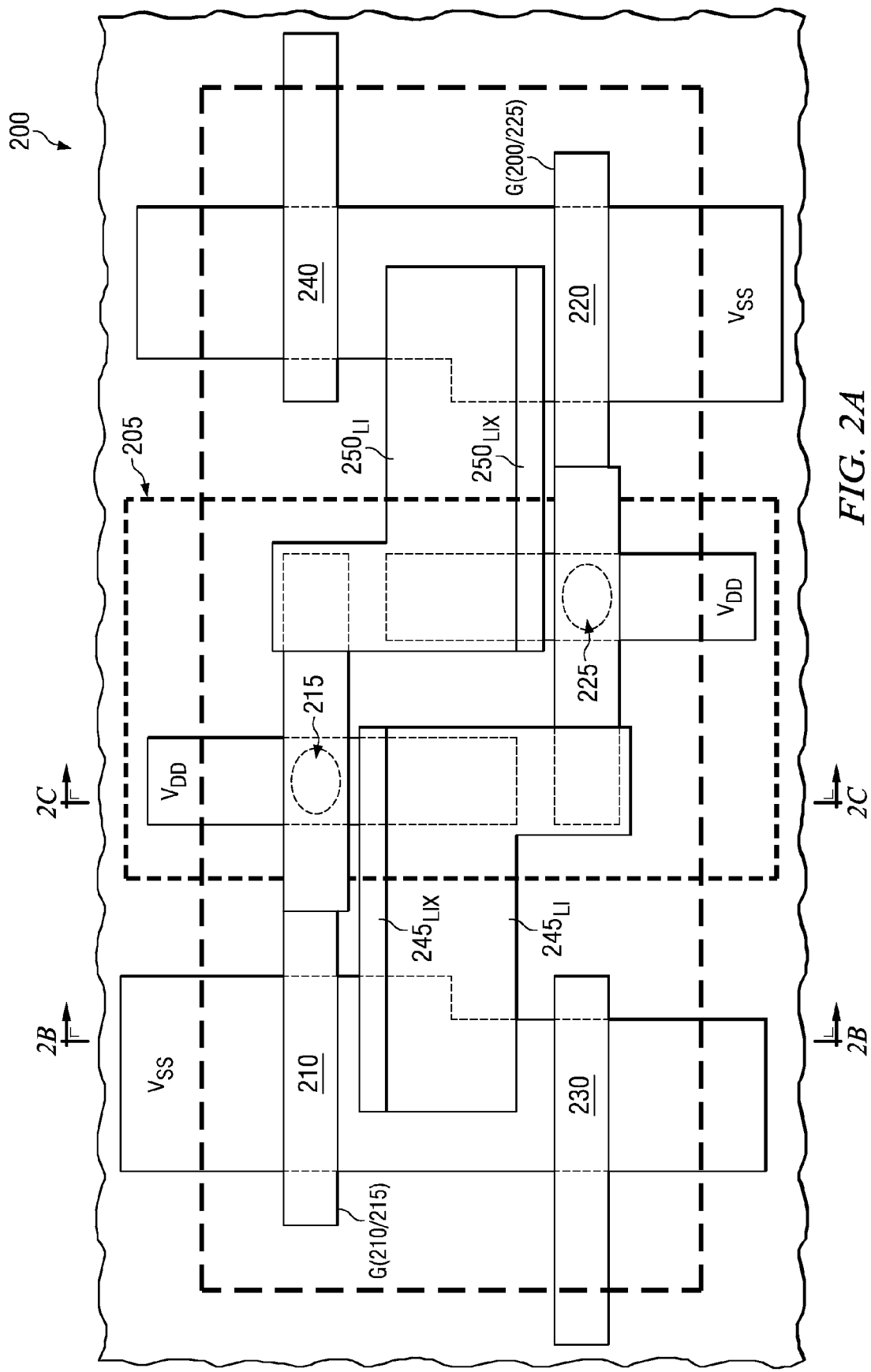
FIGS. 2A, 2B and 2C illustrate an example of a physical layout corresponding to the 6T SRAM cell of FIG. 1 and employing an embodiment of a feedback structure constructed according to the principles of the present disclosure.
Figure 2B:
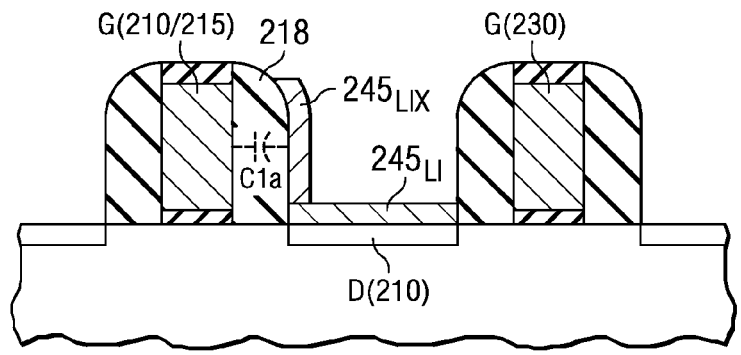
Figure 2C:
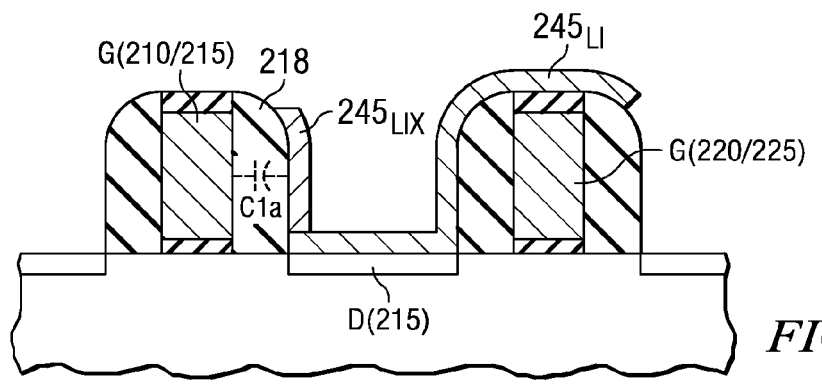

FIGS. 2A, 2B and 2C illustrate an example of a physical layout 200 corresponding to the 6T SRAM cell 100 of FIG. 1 and employing an embodiment of a feedback structure constructed according to the principles of the present disclosure. The physical layout 200 employs a p-type substrate and, for clarity, focuses only on transistor active and gate structures. The layout of the bit lines, word line and power supply lines may follow standard procedures familiar to one skilled in the pertinent art. One embodiment of a feedback structure employing an example of interconnect extensions is presented in the physical layout 200.

The illustrated embodiment of the first and second CMOS inverters 105*a*, 105*b* employ first and second n-type MOS pull-down transistors 210, 220 that are connected to corresponding first and second p-type MOS pull-up transistors 215, 225. The first and second n-type MOS pull-down transistors 210, 220 are formed in and on the p-type substrate. The corresponding first and second p-type MOS pull-up transistors 215, 225 are formed in and on an n-well 205 contained in the p-type substrate.

Gates of the first pull-down and pull-up MOS transistors 210, 215 have a first common gate structure G(210/215) wherein they are connected using a single strip of gate material (e.g., polysilicon). Similarly, gates of the second pull-down and pull-up MOS transistors 220, 225 have a second common gate structure G(220/225). Active and gate structures are also shown for the first and second pass-gate MOS transistors 230, 240.

A first local interconnect $245_{LI}$ electrically connects the drain D(210) of the first pull-down MOS transistor 210 to the drain D(215) of the first pull-up MOS transistor 215 and provides further electrical connection to the second common gate structure G(220/225) thereby forming a first portion of a memory element. Similarly, a second local interconnect $250_{LI}$ electrically connects the drain D(220) of the second pull-down MOS transistor 220 to the drain D(225) of the second pull-up MOS transistor 225 and provides further electrical connection to the first common gate structure G(210/215) thereby completing connection of the memory element. FIGS. 2B and 2C, which are first and second sectional views, provide improved clarity of these interconnections for the first local interconnect $245_{LI}$.

In the illustrated embodiment, first and second local interconnect extensions $245_{LIX}$, $250_{LIX}$ proximately extend along a portion of a side of the first and second common gate structures G(210/215), G(220/225), respectively. As an example, the proximity (i.e., a first proximity) of the first local interconnect extension $245_{LIX}$ to the side of the first common gate structure G(210/215) may be more clearly seen in FIGS. 2B and 2C. Electrical connection of the first local interconnect $245_{LI}$ to the second common gate structure G(220/225) may be seen in FIG. 2C.

A first incremental capacitance C1*a* is created by this first proximity across an insulating layer 218, as shown. Although not shown in sectional view, a second incremental capacitance C2*a* is also created by the proximity (i.e., a second proximity) of the second local interconnect extension $250_{LIX}$ to the side of the second common gate structure G(220/225).

Figure 3B:
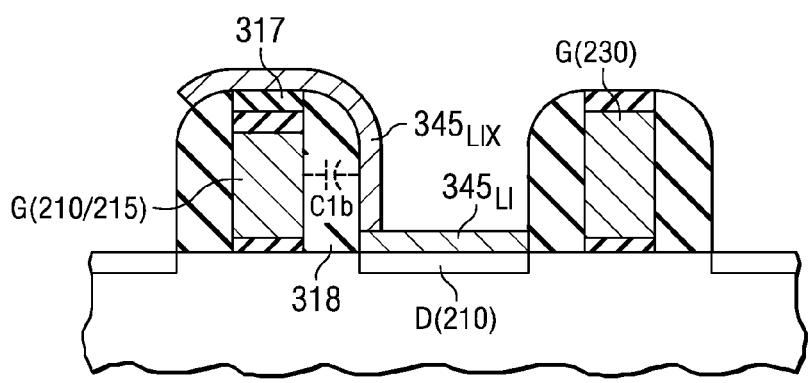
FIGS. 3A, 3B and 3C illustrate a physical layout corresponding to the 6T SRAM cell of FIG. 1 and employing another embodiment of a feedback structure constructed according to the principles of the present disclosure.
Figure 3C:
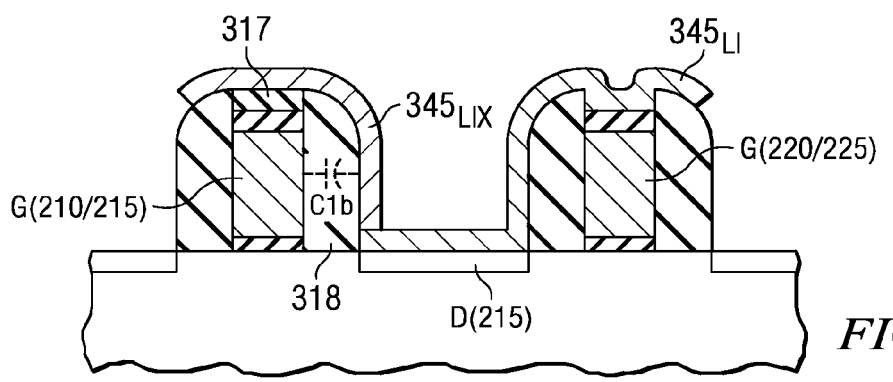
Figure 3A:
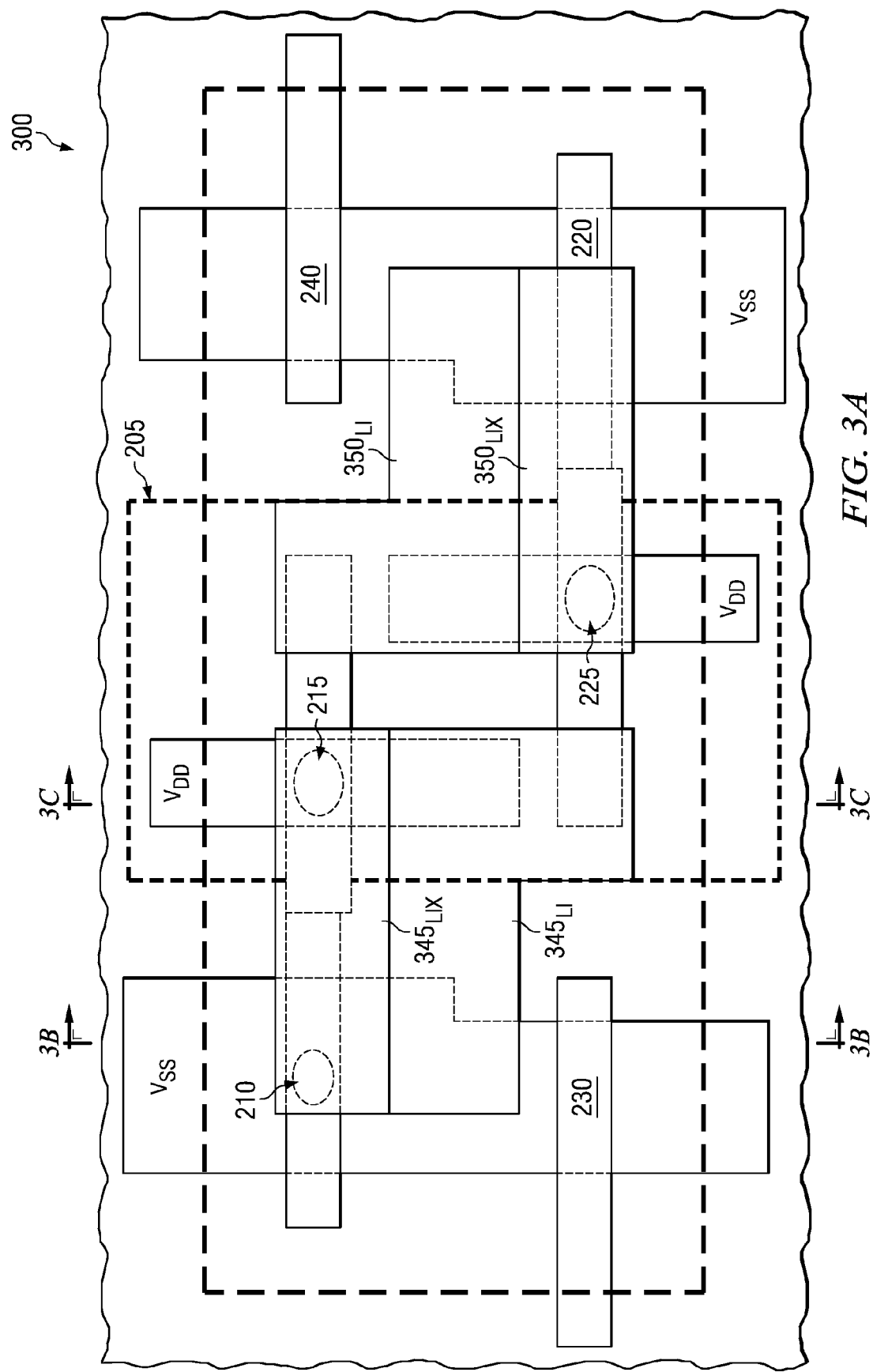

FIGS. 3A, 3B and 3C illustrate a physical layout 300 corresponding to the 6T SRAM cell 100 of FIG. 1 and employing another embodiment of a feedback structure constructed according to the principles of the present disclosure. The physical layout 300 employs many of the basic layout components of FIG. 2A as shown, and the discussion of these components with respect to FIGS. 2A, 2B and 2C may also be applied to FIGS. 3A, 3B and 3C. However, the feedback structure is a different embodiment and will be the focus of discussion for FIGS. 3A, 3B and 3C.

In the illustrated embodiment, first and second local interconnect extensions $345_{LIX}$, $350_{LIX}$ to first and second local interconnect extensions $345_{LI}$, $350_{LI}$ proximately extend along a side and a portion of a top of the first and second common gate structures G(210/215), G(220/225), respectively. Also as an example, the proximity of the first local interconnect extension $345_{LIX}$ (i.e., a first proximity) to the side and a portion of the top of the first common gate structure G(210/215) may be more clearly seen in FIGS. 3B and 3C. Electrical connection of the first local interconnect $345_{LI}$ to the second common gate structure G(220/225) may be seen in FIG. 3C.

A first incremental capacitance C1*b* is created by this first proximity across an insulating layer 318, as shown in FIGS. 3B and 3C. Although not shown in sectional view, a second incremental capacitance C2*b* is also created by the proximity (i.e., a second proximity) of the second local interconnect extension $350_{LIX}$ to the side and a portion of the top of the second common gate structure G(220/225). The first and second local interconnect extensions $345_{LIX}$, $350_{LIX}$ are electrically insulated from the first and second gate structures G(210/215), G(220/225) by an insulating material (e.g., the insulating material 317 as seen in FIGS. 3B and 3C) that is deposited on top of each of the first and second gate structures G(210/215), G(220/225).

Figure 4A:
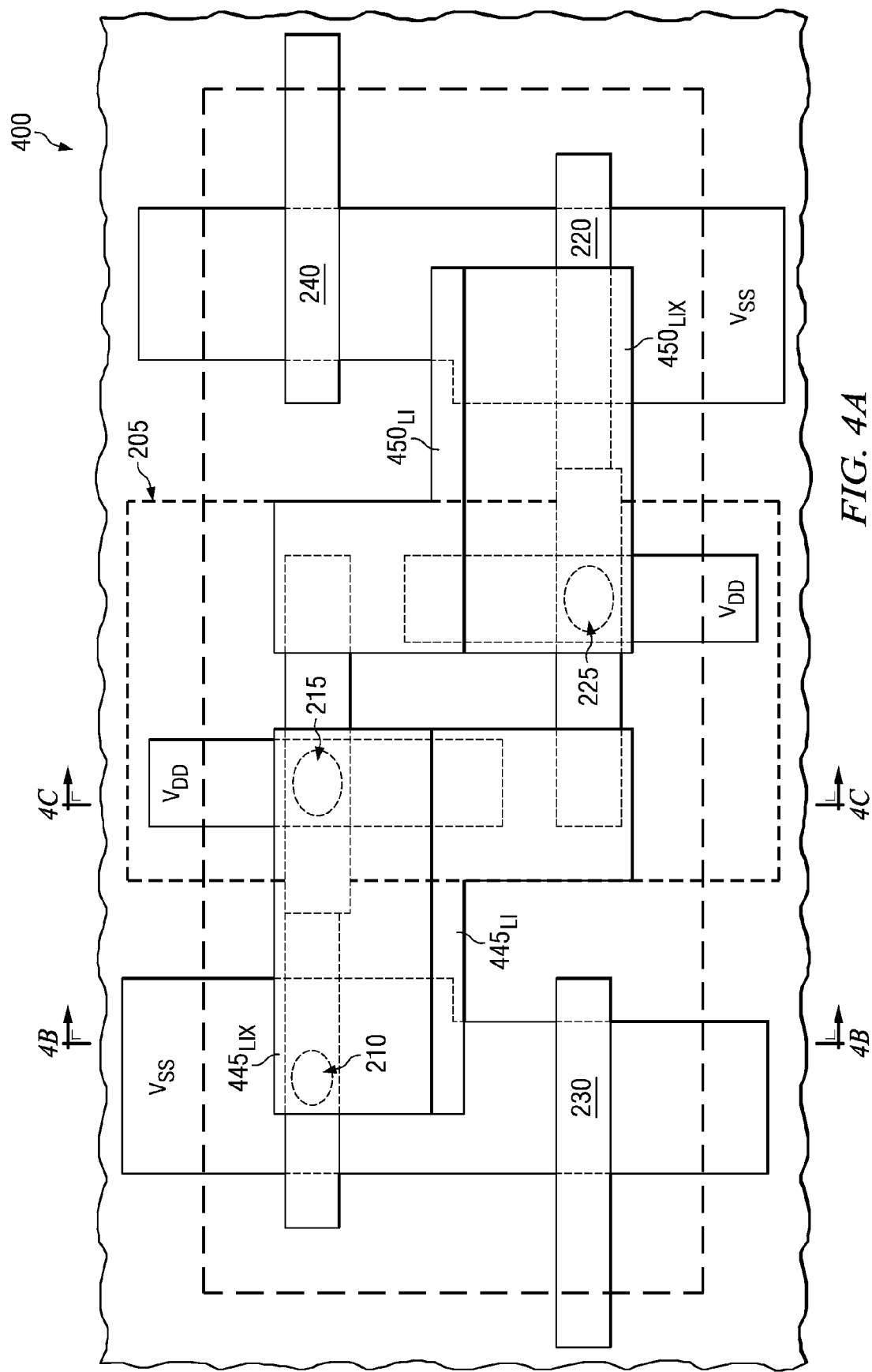
FIGS. 4A, 4B and 4C illustrate a physical layout corresponding to the 6T SRAM cell of FIG. 1 and employing yet another embodiment of a feedback structure constructed according to the principles of the present disclosure.
Figure 4B:
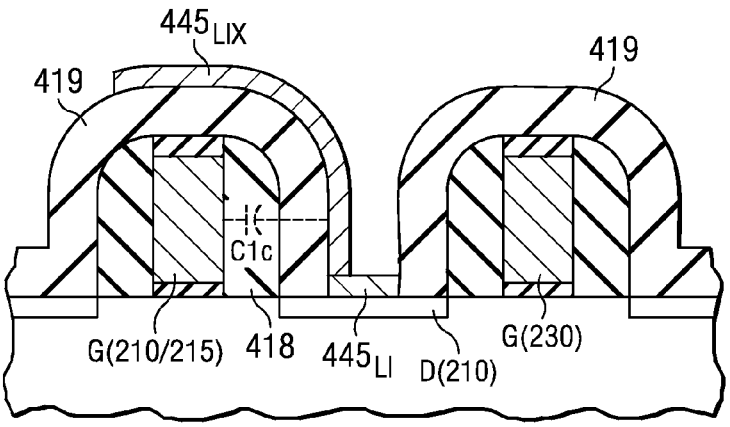
Figure 4C:
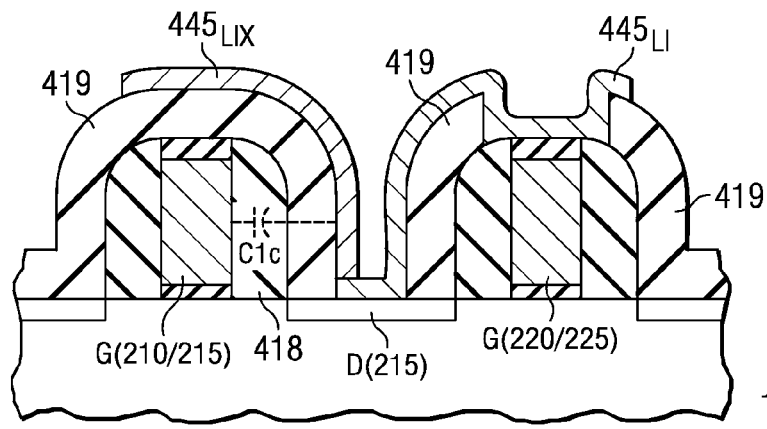

FIGS. 4A, 4B and 4C illustrate a physical layout 400 corresponding to the 6T SRAM cell 100 of FIG. 1 and employing yet another embodiment of a feedback structure constructed according to the principles of the present disclosure. The physical layout 400 also employs many of the basic layout components of FIG. 2A as shown, and the discussion of these components with respect to FIGS. 2A, 2B and 2C may also be applied to FIGS. 4A, 4B and 4C. However, a different embodiment of the feedback structure will again be the focus of discussion for FIGS. 4A, 4B and 4C.

In the illustrated embodiment, first and second local interconnect extensions $445_{LIX}$, $450_{LIX}$ to first and second local interconnects $445_{LI}$, $450_{LI}$ again proximately extend along a side and a portion of a top of the first and second common gate structures G(210/215), G(220/225), respectively. Again, as an example, the proximity of the first local interconnect extension $445_{LIX}$ (i.e., a first proximity) to the side and a portion of the top of the first common gate structure G(210/215) may be more clearly seen in FIGS. 4B and 4C. Electrical connection of the first local interconnect $445_{LI}$ to the second common gate structure G(220/225) may be seen in FIG. 4C.

A first incremental capacitance C1c is created by this first proximity across an insulating layer 418 and a pre-metal dielectric liner 419, as shown in FIGS. 4B and 4C. The pre-metal dielectric liner 419 provides electrical isolation from the first gate structure G(210/215) and generally relaxes alignment requirements between the first local interconnect extension $445_{LIX}$ and the first gate structure G(210/215).

As before, a second incremental capacitance C2c is also created by the proximity (i.e., a second proximity) of the second local interconnect extension $450_{LIX}$ to the side and a portion of the top of the second common gate structure G(220/225). The second incremental capacitance C2c is also created across another insulating layer and pre-metal dielectric liner similar to those of the first incremental capacitance C1c.

Generally, the three different feedback structures illustrated in the physical layouts 200, 300 and 400, provide three different sets of values for the first and second incremental capacitances C1, C2 due to their differing geometries between local interconnect extensions and corresponding gate structures. In the physical layouts illustrated, values of the first and second incremental capacitances C1, C2 are constructed to be substantially the same (i.e., balanced). However, other embodiments may provide differing geometries in constructing the first and second incremental capacitances C1, C2 to obtain different values for each (i.e., unbalanced) as appropriate to a particular application. Additionally, some applications may require that only one of the first and second incremental capacitances C1, C2 be constructed.

Figure 5:
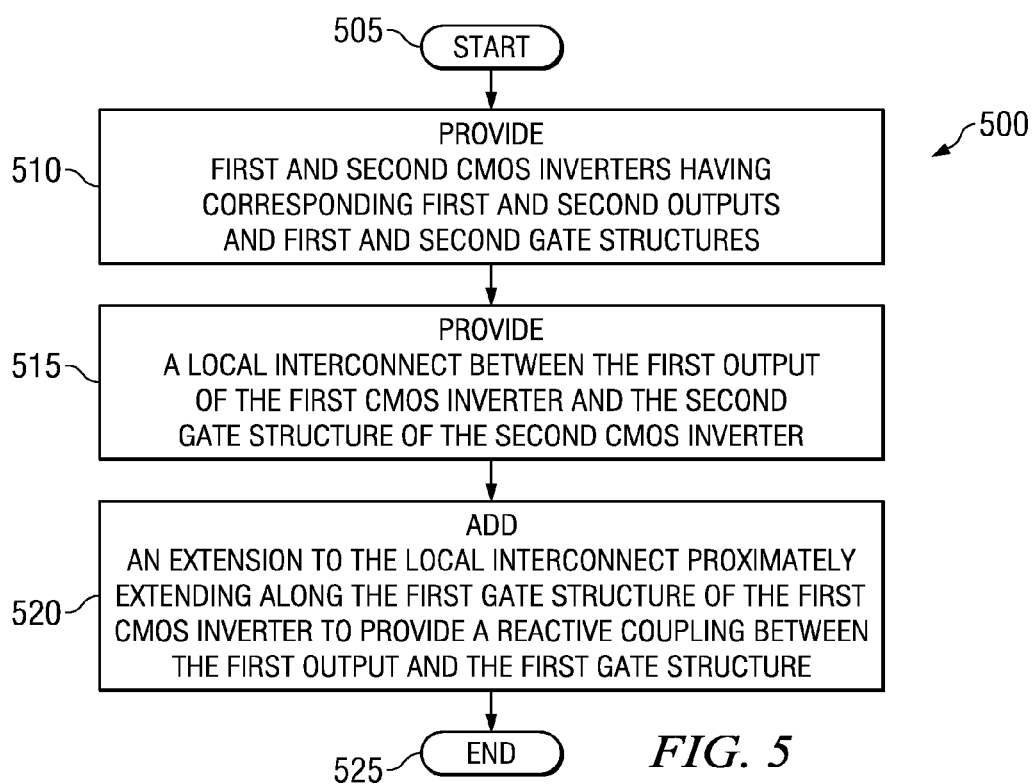
FIG. 5 illustrates an embodiment of a method of constructing a feedback structure carried out according to the principles of the present disclosure.

FIG. 5 illustrates an embodiment of a method of constructing a feedback structure 500 carried out according to the principles of the present disclosure. The method 500 is for use with an integrated circuit and starts in a step 505. Then, in a step 510, first and second CMOS inverters having corresponding first and second outputs and first and second gate structures are provided. A local interconnect between the first output of the first CMOS inverter and the second gate structure of the second CMOS inverter is provided in a step 515. In one embodiment, the second CMOS inverter is cross-coupled to the first CMOS inverter to provide a memory element.

An extension to the local interconnect is added that proximately extends along the first gate structure of the first CMOS inverter to provide a reactive coupling between the first output and the first gate structure, in a step 520. In one embodiment, the extension is added along a portion of a side of the first gate structure of the first CMOS inverter. In another embodiment, the extension is added along a side and a portion of a top of the first gate structure of the first CMOS inverter.

In one embodiment, the extension is electrically insulated from the first gate structure of the first CMOS inverter by an insulator deposited on the first gate structure. In another embodiment, the extension is isolated from the first gate structure of the first CMOS inverter by a pre-metal dielectric liner. In yet another embodiment, the reactive coupling is provided by an incremental capacitance that is created between the extension and the first gate structure. The method 500 ends in a step 525.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

In summary, embodiments of the present disclosure employing a feedback structure, a method of constructing a feedback structure and an integrated circuit have been presented. Advantages include construction of the feedback structure that is based on an extension to an existing local interconnect. This interconnect extension adds a stabilizing signal to an integrated circuit without having to add other discrete circuit components.

Those skilled in the art to which the disclosure relates will appreciate that other and further additions, deletions, substitutions and modifications may be made to the described example embodiments without departing from the disclosure.

What is claimed is:

1. A feedback structure for use with an integrated circuit, comprising:
   a CMOS inverter in the integrated circuit that includes a pull-down transistor having a first drain coupled to a pull-up transistor having a second drain;
   a local interconnect configured to electrically connect an output of the CMOS inverter to another circuit in the integrated circuit, the local interconnect also configured to electrically connect the first drain to the second drain; and
   an interconnect extension to the local interconnect configured to proximately extend along a gate structure of the CMOS inverter to provide a reactive coupling between the output and the gate structure.

2. The feedback structure as recited in claim 1 wherein the other circuit is a second CMOS inverter that is cross-coupled to the CMOS inverter to provide a memory element.

3. The feedback structure as recited in claim 1 wherein the reactive coupling is provided by an incremental capacitance between the interconnect extension and the gate structure.

4. The feedback structure as recited in claim 1 wherein the interconnect extension proximately extends along a portion of a side of the gate structure of the CMOS inverter.

5. The feedback structure as recited in claim 1 wherein the interconnect extension proximately extends along a side and a portion of a top of the gate structure of the CMOS inverter.

6. The feedback structure as recited in claim 1 wherein the interconnect extension is electrically insulated from the gate structure of the CMOS inverter by an insulator deposited on the gate structure.

7. The feedback structure as recited in claim 1 wherein the interconnect extension is isolated from the gate structure of the CMOS inverter by a pre-metal dielectric liner.

8. A method of constructing a feedback structure for use with an integrated circuit, comprising:
    providing a pull-down transistor of a CMOS inverter, the pull-down transistor having a first drain;
    adding a pull-up transistor coupled to the pull-down transistor, the pull-up transistor having a second drain
    adding a local interconnect coupled to the first drain and the second drain; the local interconnect also coupled between an output of the CMOS inverter and another circuit in the integrated circuit; and
    adding an extension to the local interconnect proximately extending along a gate structure of the CMOS inverter to provide a reactive coupling between the output and the gate structure.

9. The method as recited in claim 8 wherein the other circuit is a second CMOS inverter that is cross-coupled to the CMOS inverter to provide a memory element.

10. The method as recited in claim 8 wherein the reactive coupling is provided by an incremental capacitance between the extension and the gate structure.

11. The method as recited in claim 8 wherein the extension is added along a portion of a side of the gate structure of the CMOS inverter.

12. The method as recited in claim 8 wherein the extension is added along a side and a portion of a top of the gate structure of the CMOS inverter.

13. The method as recited in claim 8 wherein the extension is electrically insulated from the gate structure of the CMOS inverter by an insulator deposited on the gate structure.

14. The method as recited in claim 8 wherein the extension is isolated from the gate structure of the CMOS inverter by a pre-metal dielectric liner.

15. An integrated circuit having an SRAM cell, comprising:
    a pair of CMOS inverters;
    a feedback structure, including:
    first and second local interconnects that electrically connect first and second outputs to respective second and first gates of the pair of CMOS inverters to provide a memory element, and
    first and second interconnect extensions to the first and second local interconnects that proximately extend along respective first and second gate structures of the pair of CMOS inverters to provide a first reactive coupling between the first output and the first gate structure and a second reactive coupling between the second output and the second gate structure; and
    first and second pass-gate MOS transistors that are controlled by a word line and are respectively connected between the first output and a first bit line and the second output and a second bit line.

16. The integrated circuit as recited in claim 15 wherein the first and second reactive couplings are provided by a first incremental capacitance between the first interconnect extension and the first gate structure and a second incremental capacitance between the second interconnect extension and the second gate structure.

17. The integrated circuit as recited in claim 15 wherein the first and second interconnect extensions proximately extend along a portion of a side of the first and second gate structures, respectively.

18. The integrated circuit as recited in claim 15 wherein the first and second interconnect extensions proximately extend along a side and a portion of a top of the first and second gate structures, respectively.

19. The integrated circuit as recited in claim 15 wherein the first and second interconnect extensions are electrically insulated from the first and second gate structures by an insulator deposited on each of the first and second gate structures.

20. The integrated circuit as recited in claim 15 wherein the first and second interconnect extensions are isolated from the first and second gate structures by a pre-metal dielectric liner.

* * * * *